United States Patent [19]

Ingraham

[11] Patent Number: 5,087,825
[45] Date of Patent: Feb. 11, 1992

[54] CAPACITY RESPONSIVE KEYBOARD

[75] Inventor: Ronald D. Ingraham, Quincy, Mich.

[73] Assignee: Nartron Corporation, Reed City, Mich.

[21] Appl. No.: 480,293

[22] Filed: Feb. 15, 1990

[51] Int. Cl.⁵ .................... H01H 47/00; H01H 35/00
[52] U.S. Cl. ...................... 307/132 EA; 307/116; 307/132 R; 200/511; 361/280
[58] Field of Search ............... 307/116, 125, 132 R, 307/132 E, 132 EA, 132 M, 139; 200/5 A, 511, 512, 600, DIG. 1; 361/280; 178/18; 341/22, 33

[56] References Cited

U.S. PATENT DOCUMENTS

| | | | |
|---|---|---|---|
| 2,783,308 | 2/1957 | Rug | 379/167 |
| 3,040,178 | 6/1962 | Lyman et al. | 250/213 A |
| 3,200,304 | 8/1965 | Atkins et al. | 361/179 |
| 3,200,305 | 8/1965 | Atkins et al. | 361/179 |
| 3,200,306 | 8/1965 | Atkins et al. | 361/179 |
| 3,254,313 | 5/1966 | Atkins et al. | 331/111 |
| 3,275,897 | 9/1966 | Atkins et al. | 361/181 |
| 3,549,909 | 12/1970 | Adelson | 307/631 |
| 3,641,410 | 2/1972 | Vogelsberg | 388/830 |
| 3,651,391 | 3/1972 | Vogelsberg | 318/466 |
| 3,666,988 | 5/1972 | Bellis | 315/208 |
| 3,798,370 | 3/1974 | Hurst | 178/18 |
| 3,846,791 | 11/1974 | Foster | 341/33 |
| 3,899,713 | 8/1975 | Barkan et al. | 315/34 |
| 3,911,215 | 10/1975 | Hurst et al. | 178/18 |
| 3,965,465 | 6/1976 | Alexander | 340/527 |
| 3,984,757 | 10/1976 | Gott et al. | 323/326 |
| 4,016,453 | 4/1977 | Moenning | 315/312 |
| 4,031,408 | 6/1977 | Holz | 307/116 |
| 4,056,699 | 11/1977 | Jordan | 200/5 A |
| 4,071,689 | 1/1978 | Talmage et al. | 178/18 |
| 4,090,092 | 5/1978 | Serrano | 307/116 |
| 4,101,805 | 7/1978 | Stone | 315/74 |
| 4,101,886 | 7/1978 | Grimes et al. | 165/14 |
| 4,119,864 | 10/1978 | Petrizio | 307/116 |
| 4,123,631 | 10/1978 | Lewis | 200/600 |
| 4,136,291 | 1/1979 | Waldron | 307/308 |
| 4,145,748 | 3/1979 | Eichelberger et al. | 307/125 |
| 4,152,629 | 5/1979 | Raupp | 315/362 |
| 4,159,473 | 6/1979 | Senk | 340/565 |
| 4,161,766 | 7/1979 | Castleberry et al. | 361/280 |
| 4,174,517 | 11/1979 | Mandel | 340/310 A |
| 4,210,822 | 7/1980 | Wern | 307/116 |
| 4,211,959 | 7/1980 | Deavenport | 315/362 |
| 4,213,061 | 7/1980 | Conner | 307/116 |
| 4,220,815 | 9/1980 | Gibson et al. | 178/18 |
| 4,223,301 | 9/1980 | Grimes et al. | 340/500 |
| 4,237,386 | 12/1980 | Instance | 307/116 |
| 4,237,421 | 12/1980 | Waldron | 307/116 |
| 4,246,533 | 1/1981 | Chiang | 323/349 |
| 4,257,117 | 3/1981 | Besson | 307/116 |
| 4,264,831 | 4/1981 | Wern | 307/638 |
| 4,289,972 | 9/1981 | Wern | 307/116 |
| 4,289,980 | 9/1981 | McLaughlin | 307/308 |
| 4,290,052 | 9/1981 | Eichelberger et al. | 341/33 |
| 4,293,987 | 10/1981 | Gottbrecht | 29/25.42 |
| 4,304,976 | 12/1981 | Gottbrecht | 219/10.55 B |
| 4,308,443 | 12/1981 | Tucker et al. | 219/10.493 |
| 4,323,829 | 4/1982 | Whitney et al. | 318/55 |
| 4,360,737 | 11/1982 | Leopold | 307/116 |
| 4,374,381 | 2/1983 | Ng et al. | 340/711 |
| 4,380,040 | 4/1983 | Posset | 361/278 |
| 4,394,643 | 7/1983 | Williams | 341/33 |
| 4,400,758 | 8/1983 | Frame | 361/288 |

(List continued on next page.)

Assistant Examiner—Jeffrey A. Gaffin
Attorney, Agent, or Firm—Price, Heneveld, Cooper, DeWitt & Litton

[57] ABSTRACT

A capacity responsive keyboard which eliminates the necessity for metal films on the touch surface includes an insulated substrate having a plurality of electrically conductive plate members mounted thereon and a dielectric member positioned over the plate members. A piece of compressible, electrically-conductive foam is compressed between each plate member and the dielectric member to eliminate air from the electrical path between the dielectric member and the plate members. A grid of conductor segments separates the plate members defining a guard band to reduce interference between the switches. The guard band is connected with one power supply line of a switching circuit which produces outputs in response to capacity changes caused by a user touching the dielectric member.

18 Claims, 2 Drawing Sheets

U.S. PATENT DOCUMENTS

| | | | |
|---|---|---|---|
| 4,413,252 | 11/1983 | Tyler et al. | 341/33 |
| 4,439,647 | 3/1984 | Calandrello et al. | 200/5 A |
| 4,476,463 | 10/1984 | Ng et al. | 340/712 |
| 4,493,377 | 1/1985 | Günther et al. | 173/170 |
| 4,495,485 | 1/1985 | Smith | 341/33 |
| 4,529,968 | 7/1985 | Hilsum et al. | 340/635 |
| 4,535,254 | 8/1985 | Khatri | 307/38 |
| 4,550,310 | 10/1985 | Yamaguchi et al. | 341/33 |
| 4,561,002 | 12/1985 | Chui | 341/26 |
| 4,567,470 | 1/1986 | Yoshikawa et al. | 341/33 |
| 4,584,519 | 4/1986 | Gruodis | 323/245 |
| 4,614,937 | 9/9186 | Poujois | 341/33 |
| 4,651,133 | 3/1987 | Ganesan et al. | 341/26 |
| 4,731,548 | 3/1988 | Ingraham | 307/116 |
| 4,731,694 | 3/1988 | Grabner et al. | 361/280 |
| 4,736,190 | 4/1988 | Fiorella | 200/517 |
| 4,740,781 | 4/1988 | Brown | 340/712 |
| 4,743,895 | 5/1988 | Alexander | 340/712 |
| 4,758,735 | 7/1988 | Ingraham | 307/116 |
| 4,831,279 | 5/1989 | Ingraham | 307/116 |
| 4,855,550 | 8/1989 | Schultz, Jr. | 200/600 |
| 4,894,493 | 1/1990 | Smith et al. | 200/5 A |
| 4,901,074 | 2/1990 | Sinn et al. | 341/22 |
| 4,920,343 | 4/1990 | Schwartz | 341/33 |
| 4,924,222 | 5/1990 | Antikidis et al. | 200/600 |
| 5,012,124 | 4/1991 | Holloway | 307/116 |

*Primary Examiner*—A. D. Pellinen

CAPACITY RESPONSIVE KEYBOARD

BACKGROUND OF THE INVENTION

This invention relates to switches that respond to the change in capacity from a user touching a surface portion of the switch. The invention is especially adapted for a keyboard made up of a plurality of such capacity responsive switches.

Touch-responsive switches in the form of "capacitive glass" are common in the appliance field. This special glass has conductive elements fired on each side in a manner that forms a pair of series-connected capacitors having input and output terminals on the glass surface facing away from the user. A common plate of the two capacitors is formed on the outer glass surface facing the user. A high frequency oscillator applies pulses to the capacitors. A switching circuit connected with the capacitors interprets the presence of pulses as a no-input condition. When a user touches the capacitor plate on the outer surface of the glass, the high frequency pulses are shunted to ground through the user. The switch circuit interprets the absence of pulses as a positive input condition and responds by actuating an output device. Such a switch system is illustrated in U.S. Pat. No. 4,308,443, issued to Tucker et al.

Such "capacitive-glass" switch systems are not truly capacity responsive but require physical contact by the user with the electrically-conductive common plate of the series capacitors. This requires a metal film, such as tin oxide, be deposited on the outer surface of the glass. Such metal film is subject to abrasion by repeated cleaning and may even abrade to the point of erratic operation. A further problem with such system is that a failure of the high frequency oscillator causes a no-pulse condition, to which the switching circuit may detrimentally respond by energizing one or more outputs.

In my U.S. Pat. Nos. 4,731,548 and 4,758,735 I disclose touch control switch circuits which respond to a change in the capacity-to-ground of a plate member as a result of contact by the body of a user. Such circuits do not require a metal film on the surface portion contacted by the user so the problem of metal film abrasion is avoided. Further, the circuits disclosed in my patents are not subject to the catastrophic failure of erroneous output switching caused by the failure of an oscillator.

SUMMARY OF THE INVENTION

The present invention is directed to a keyboard system incorporating a plurality of capacity responsive switches in a keyboard assembly that may be used with a control circuit that embodies the principles of my aforementioned patents. The present invention may be embodied in a capacity responsive keyboard system having a planar substrate with a plurality of electrically conductive plate members mounted thereto and insulated from each other. A substantially rigid planar dielectric member overlies the conductive members and has a surface facing the conductive members. A plurality of flexible electrically conductive transmission members extend between the dielectric member and individual conductive members. The transmission members are sized to provide airtight interfaces with the dielectric member and the associated plate member. Circuit means connected with the plate members respond to capacity between the plate members and ground for producing a signal indicative of a change in capacity between plate members and ground.

Another problem overcome by the present invention is the tendency of capacity responsive switches that are closely positioned in a keyboard system to inadvertently become actuated even though the user is touching an adjacent switch. This problem is overcome by a keyboard system which embodies the present invention and in which an electrically conductive guard band is provided on the substrate between adjacent plate members. The guard band is connected with a reference voltage of the control circuit to isolate the capacity change caused by the user to only one switch. These and other objects, advantages and features of this invention will become apparent upon review of the following specification in conjunction with the drawings.

DESCRIPTION OF THE PREFERRED EMBODIMENT

Figures 1, 2:
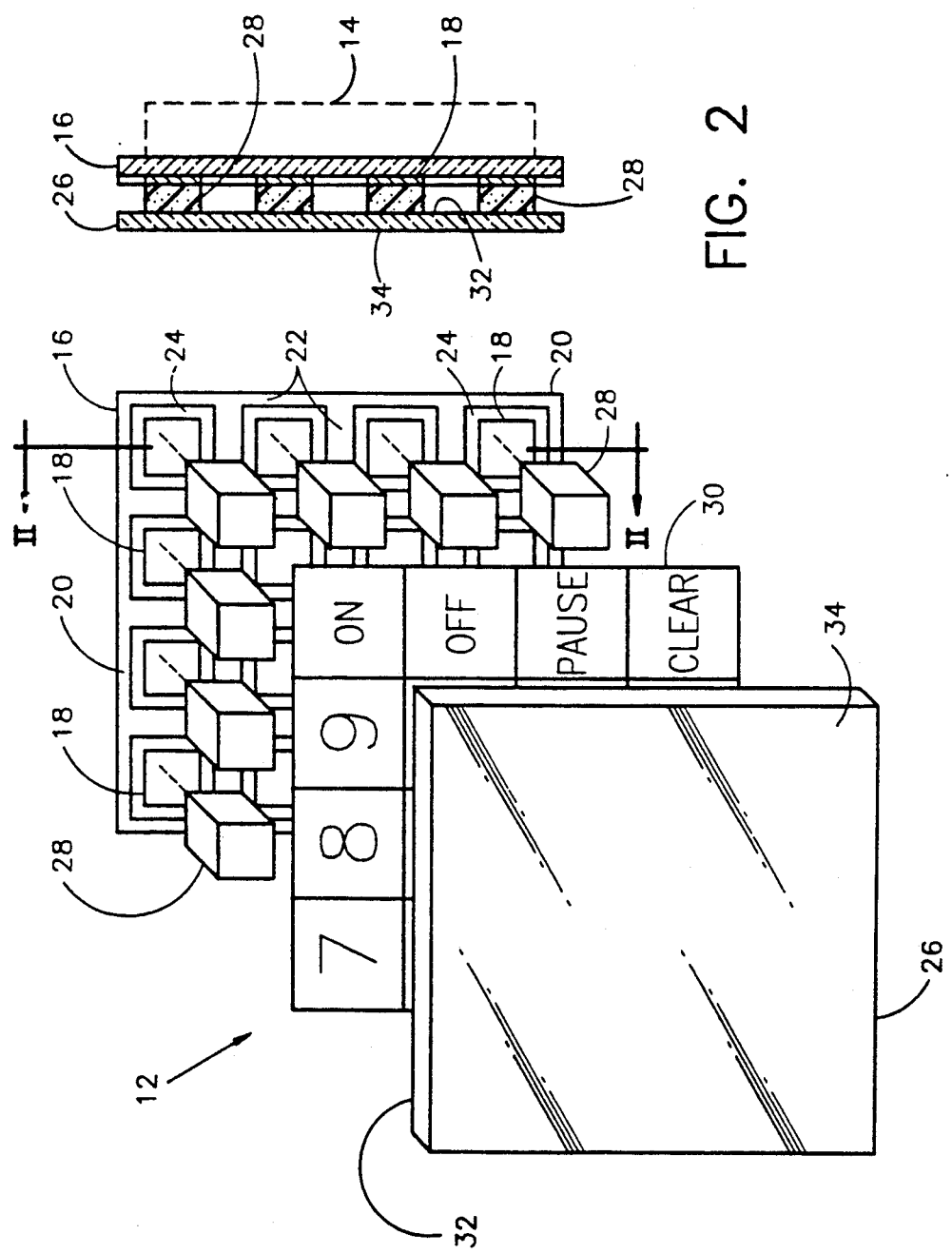
FIG. 1 is an exploded perspective view of a capacitive responsive keyboard embodying the invention.
FIG. 2 is a side elevation of the keyboard in FIG. 1.
Figure 3:
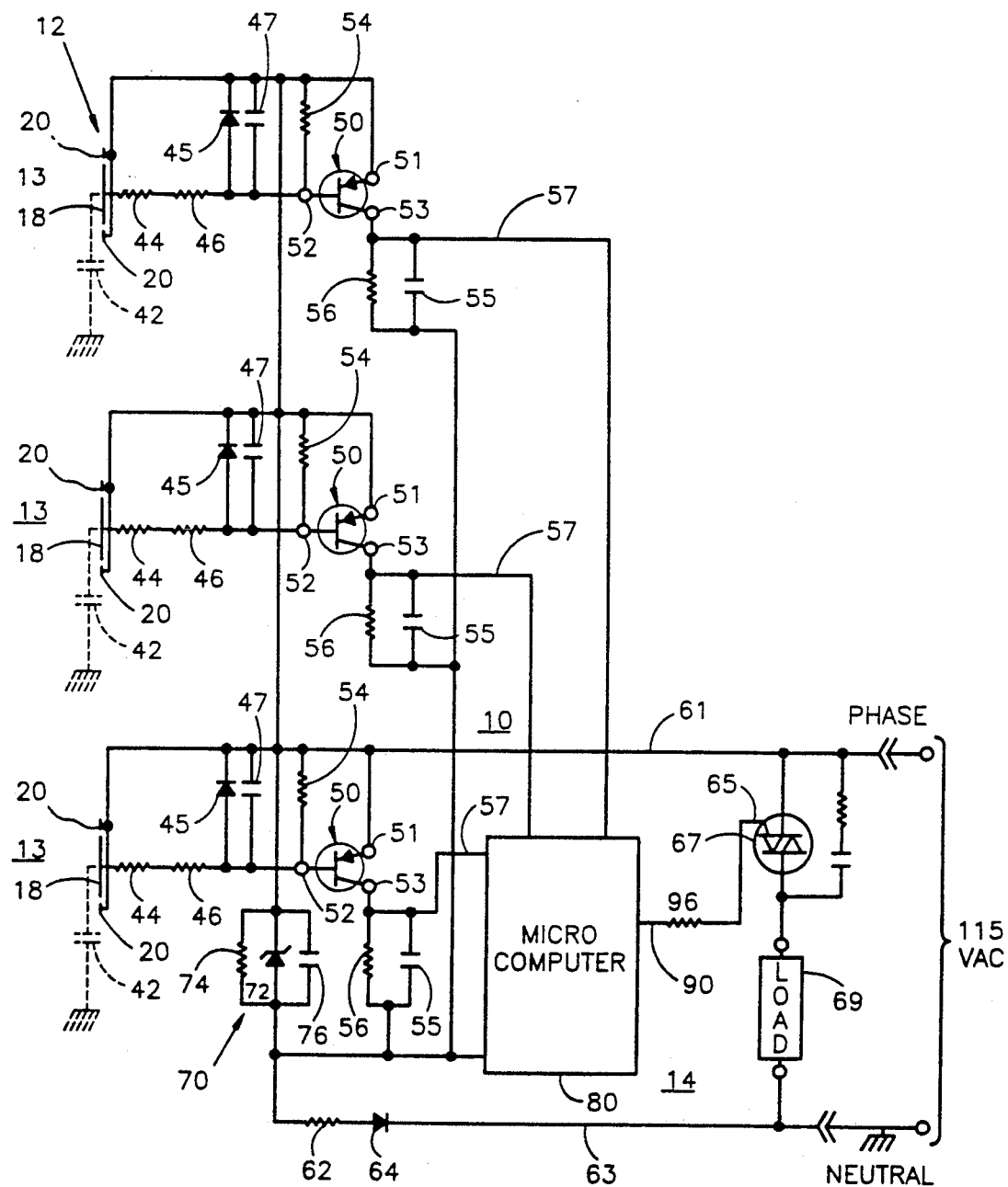
FIG. 3 is a schematic diagram of a control circuit useful with the invention.

Referring now specifically to the drawings, and the illustrative embodiments depicted therein, a capacity responsive keyboard system 10 includes a touch plate assembly 12 and a control circuit 14 connected with touch plate assembly 12 (FIG. 3). FIG. 3 illustrates a plurality of input portions 13 of touch plate assembly 12 and a control circuit 14 that actuates a single load 69 such as an electric motor. However, it should be understood that the keyboard system 10 may include a greater or lesser number of input portions 13 than illustrated, depending on the number and variety of modes in which load 69 may be controlled. Additionally, more than one load 69 may be controlled. Touch plate assembly 12 includes a substrate 16 on which a plurality of electrically conductive plate members 18 are mounted on one surface thereof. Substrate 16 is an insulator and plates 18 are spaced apart in order to insulate plates 18 from one another and from ground. Also positioned on substrate 16 is a guard band, generally shown at 20. Guard band 20 is a grid of conductor segments 22 extending between adjacent pairs of plate members 18. All conductor segments 22 are physically and electrically interconnected to define a plurality of spaces 24 with one plate member 18 positioned centrally within each space 24. Components of control circuit 14 may be positioned on the side of substrate 16 opposite plate members 18 and guard band 20 (FIG. 2).

A planar dielectric member 26 is spaced from substrate 16 facing plate members 18. Dielectric member 26 is made from a non-porous insulating material such as polycarbonate or glass. A plurality of flexible, electrically conductive transmission members 28 are sandwiched between a surface 32 of dielectric member 26 and substrate 16. Each transmission member 28 has a cross section approximately the size of plate members 18 and is positioned to overlie one of the plate members 18. An indicia layer 30 may be adhered to surface 32 of dielectric member 26 which faces substrate 16. The purpose of indicia layer 30 is to provide an indication of the function of each input portion 13.

Touch plate assembly 10 is adapted to providing a capacity interface with a user. When a user touches outwardly-facing surface 34 of dielectric member 26, the capacity-to-ground for the corresponding plate member 18 is increased substantially, as illustrated by capacitor 42 in FIG. 3. Because the dielectric constant of air is much greater than that of dielectric member 26, it has been found to be necessary to exclude substantially all of the air from the electrical path between plate members 18 and dielectric member 26. This is the function of flexible transmission members 28. In the illustrated embodiment, transmission members 28 are made from compressible, conducting polymeric foam and are dimensioned to be under compression when dielectric member 34 and substrate 16 are positioned as illustrated in FIG. 2. Because transmission members 28 are under compression, air is excluded from the interface between the transmission members and their respective plate members 18 and between the transmission members and surface 32 of dielectric member 26.

A detailed description of control circuit 14 is provided in U.S. Pat. No. 4,731,548, issued Mar. 15, 1988 to Ronald Ingraham, the disclosure of which is hereby incorporated herein by reference. Although a complete description of the operation of circuit 14 will not be repeated herein, suffice it to say that a voltage divider is established between a capacitor 47 and the capacity 42 of the user touching one input portion 13. Capacitor 47 extends between one power line 61 and the base 52 of a PNP transistor 50. Thus, when a user is not touching the particular touch input portion 13, capacitor 47 pulls base 52 of transistor 50 to a high level which reverse-biases the base-emitter junction of the transistor. Thus, transistor 50 will not be conducting. When an individual touches input portion 13, the voltage level on base 52 drops sufficiently to establish a forward-biased base emitter junction for the transistor. This causes transistor 50 to conduct, which provides an input signal on line 57 to a microcomputer 80. Microcomputer 80 has an output port 90 connected through resistor 96 to the gate 65 of a triac 67. Triac 67 is connected in series with a load 69 that is proportional to the phase angle provided by microcomputer 80 with respect to line 61. The signal produced on output port 90 is determined by the program logic of microcomputer 80. Thus, when a user touches an input portion, the current to load 69 is either started, stopped, increased or decreased.

In order to accommodate close spacing between individual switches in touch plate assembly 12, a guard band 20 is provided to electrostatically separate plate members 18 from each other. All conductor segments 22 which make up the grid-like arrangement of guard band 20 are electrically interconnected and are connected to emitter 51 of transistor 50 which, in the illustrated embodiment, coincides with power source line 61. With this guard band arrangement, the increase in capacity for one plate member 18 does not result in a corresponding increase in the capacity of adjacent plate members 18. There is no requirement for an electrically conductive transmission member between guard band 20 and dielectric member 26. However, one or more isolation resistors similar to resistors 44, 46 that isolate plate member 18 for ensuring safety, may also be provided between guard band 20 and emitter 51. Guard band 20 may also be extended to the physical space separating lines 57 extending to microcomputer 80.

In the illustrated embodiment, substrate 16 is a conventional printed circuit board with plate members 18 and guard band 20 etched from one conductive surface thereof. Dielectric member 26 is preferably polycarbonate in order to reduce its susceptibility to breakage. In a preferred embodiment, the thickness of dielectric member 26 is 0.1" but the thickness may extend up to one-half and even three-quarter inches. Glass is a suitable alternative to polycarbonate. Compressible, conductive transmission members 28 may be made from any compressible open-cell or closed-cell polymeric foam in which a high percentage of carbon particles are mixed with the binder. Such foams are commercially available and are sold by Wescorp under the WESTAT foam trademark, Model Series W-2700. In the illustrated embodiment, indicia layer 30 is screened and dried on surface 32 of dielectric member 36 but may optionally be applied to outer surface 34. Transmission members 28 may be electrically connected with the corresponding plate members 18 or may contact a conformal coating covering the entire surface of substrate 16 facing dielectric member 26. The primary requirement is that air be eliminated from the interface between transmission members 28 and substrate 16. It has been found that the response of the keyboard system may be "tuned" by adjusting the values of capacitor 47 for each input portion 13 to provide equal sensitivity.

The present invention overcomes the difficulties of assembling true capacity-responsive switching devices in a keyboard assembly. The ability to eliminate an air-entrapped interface between the pad members and the dielectric member in a keyboard presents planar alignment problems because of the multitude of switch members. The present invention overcomes this difficulty without the necessity of physically attaching terminals to the back of the dielectric member. Furthermore, the use of a guard band around the pad members and connected to one of the power sources of the control circuit, allows a close spacing of the individual switch members.

Changes and modifications to the specifically described embodiments can be carried out without departing from the principles of the invention which is intended to be limited only by the scope of the appended claims, as interpreted according to the principles of patent law, including the doctrine of equivalents.

The embodiments of the invention in which an exclusive property or privilege is claimed are defined as follows:

1. A capacity responsive keyboard system comprising:
    a substrate having a plurality of electrically conductive plate members mounted thereto, said plate members being insulated from each other;
    a substantially rigid dielectric member overlying said plate members having a surface facing said plate members;
    a plurality of electrically conductive transmission members, each of said transmission members being a compressible conductive polymer extending between said dielectric member and one of said plate members in order to provide an airtight interface with said dielectric member and with the associated one of said plate members; and
    circuit means connected with said plate members and responsive to capacity between said plate members and ground for providing a signal indicative of a change in capacity between at least one of said plate members and ground.

2. The keyboard system in claim 1 in which said circuit means includes a plurality of voltage responsive switch means, each of said switch means having an input connected with one of said plate members and means responsive to a change in voltage of said input for producing a signal.

3. The keyboard system in claim 2 further including a reference voltage and at least one capacitor having a first terminal connected to said reference voltage and a second terminal connected to one said input such that the voltage across said one capacitor produced by said reference voltage is changed when the capacity between the associated one of said plate members and ground is changed.

4. The keyboard system in claim 3 further including an electrically conductive guard member extending between at least two of said plate members, said guard member being connected to said reference voltage.

5. The keyboard system in claim 1 further including an indicia layer adhered to said surface of said dielectric member facing said plate members.

6. The keyboard system in claim 1 wherein said dielectric member is made from polycarbonate.

7. A capacity responsive keyboard system comprising:
- a planar substrate having a plurality of electrically conductive plate members mounted thereto, said plate members being insulated from each other;
- a substantially rigid planar dielectric member overlying said plate members and having a surface facing said plate members and spaced a predetermined distance therefrom;
- a plurality of electrically conductive transmission members between said dielectric member and said planar substrate, each of said transmission members made from compressible conductive polymer and extending between said dielectric member and one of said plate members, each of said transmission members having a length greater than said predetermined distance such that said transmission members will be compressed between said dielectric member and said plate members; and
- circuit means connected with said plate members and responsive to the value of capacity between said plate members and ground for producing output signals in response to changes in capacity between said plate members and ground.

8. The keyboard system in claim 7 in which said circuit means includes a plurality of voltage responsive switch means, each of said switch means having an input connected with one of said plate members and means responsive to a change in voltage of said input for producing an output signal.

9. The keyboard system in claim 8 further including a reference voltage and at least one capacitor associated with each of said switch means and having a first terminal connected to said reference voltage and a second terminal connected to the input of the corresponding said switch means such that the voltage across said one capacitor produced by said reference voltage is changed when the capacity between the associated one of said plate members and ground is changed.

10. The keyboard system in claim 9 further including an electrically conductive guard member extending between each adjacent pair of said plate members, said guard members being connected to said reference voltage.

11. The keyboard system in claim 7 further including an indicia layer adhered to said surface of said dielectric member facing said plate members.

12. The keyboard system in claim 7 wherein said dielectric member is made from polycarbonate.

13. A capacity responsive keyboard system comprising:
- a planar substrate having an isolation grid thereon, said grid including a plurality of interconnected intersecting electrical conductor segments defining spaces between said conductor segments;
- a plurality of electrically conductive plate members mounted to said planar substrate within said grid with one of said plate members in each of said spaces between conductor segments;
- a substantially rigid planar dielectric member overlying said plate members and having a surface facing said plate members and spaced a predetermined distance therefrom;
- a plurality of electrically plate transmission members between said dielectric member and said planar substrate, each of said transmission members made from compressible conductive polymer and extending between said dielectric member and one of said plate members, each of said transmission members having a length greater than said predetermined distance such that said transmission members will be compressed between said dielectric member and said plate members; and
- circuit means connected with said plate members and said isolation grid for producing distinct output signals in response to changes in capacity between each of said plate members and ground, said circuit means including a reference voltage, said isolation grid being connected with said reference voltage.

14. The keyboard system in claim 13 in which said circuit means includes a plurality of voltage responsive switch means, each of said switch means having an input connected with one of said plate members and means responsive to a change in voltage of said input for producing one of said distinct output signal.

15. The keyboard system in claim 14 further including at least one capacitor associated with each of said switch means and having a first terminal connected to said reference voltage and a second terminal connected to the input of the corresponding said switch means such that the voltage across said one capacitor produced by said reference voltage is changed when the capacity between the associated one of said plate members and ground is changed.

16. The keyboard system in claim 13 further including an indicia layer adhered to said surface of said dielectric member facing said plate members.

17. The keyboard system in claim 13 wherein said dielectric member is made from polycarbonate.

18. The keyboard system in claim 13 wherein said dielectric member is made from glass.

* * * * *

UNITED STATES PATENT AND TRADEMARK OFFICE
CERTIFICATE OF CORRECTION

PATENT NO. : 5,087,825
DATED : February 11, 1992
INVENTOR(S) : Ronald D. Ingraham It is certified that error appears in the above-identified patent and that said Letters Patent is hereby corrected as shown below:

Column 6, Claim 13, Line 25:

After "electrically" insert -- conductive --.

Signed and Sealed this

Twenty-sixth Day of October, 1993

*Attest:*

BRUCE LEHMAN

*Attesting Officer*  *Commissioner of Patents and Trademarks*